United States Patent [19]

Gris

[11] Patent Number: 4,891,328
[45] Date of Patent: Jan. 2, 1990

[54] METHOD OF MANUFACTURING FIELD EFFECT TRANSISTORS AND LATERAL BIPOLAR TRANSISTORS ON THE SAME SUBSTRATE

[75] Inventor: Yvon Gris, Les Obdonniers, France

[73] Assignee: Societe Pour l'Etude et la Fabrication de Circuits Integres Speciauxefcis, Grenoble, France

[21] Appl. No.: 855,104

[22] Filed: Apr. 23, 1986

[30] Foreign Application Priority Data

Apr. 26, 1985 [FR] France .................. 85 06442

[51] Int. Cl.⁴ ........................... H01L 21/265
[52] U.S. Cl. ........................ 437/59; 437/31; 437/57; 437/34
[58] Field of Search ............... 357/34, 35, 43; 29/571, 29/576 W, 577 C; 148/1.5; 437/31, 34, 59, 56, 57, 233, 200

[56] References Cited

U.S. PATENT DOCUMENTS

| 4,157,269 | 6/1979 | Ning et al. ............... 148/1.5 |
| 4,259,680 | 3/1981 | Lepselter et al. ........ 357/35 |
| 4,470,852 | 9/1984 | Ellsworth ................ 29/571 |
| 4,593,454 | 6/1986 | Baudrant et al. ........ 29/571 |
| 4,604,790 | 8/1986 | Bonn ..................... 29/571 |
| 4,619,038 | 10/1986 | Pintchovski ............ 148/DIG. 147 |

Primary Examiner—Brian E. Hearn
Assistant Examiner—Kevin McAndrews
Attorney, Agent, or Firm—Oblon, Spivak, McClelland, Maier & Neustadt

[57] ABSTRACT

The invention provides a method for manufacturing integrated circuits.

For forming circuits incorporating bipolar transistors by CMOS technology for a low cost price, a succession of steps are carried out using only 9 successive masks so as to obtain more particularly a lateral NPN bipolar transistor in a P caisson on an N substrate. The source and drain contacts are made from metal silicide, as well as the base contact. The emitter and collector contacts are made from polycrystalline silicon covered with silicide. The N transistor is self aligned with a low access resistance and a low junction depth. The ionic source and drain implantation of the TMOSP on the one hand and of the bipolar base on the other is common. In addition, the access resistance to the P type transistor and gate covering over the sources and drains of this transistor are minimized while leaving a great latitude of choice for doping of the base of the bipolar transistor.

7 Claims, 3 Drawing Sheets

FIG_1
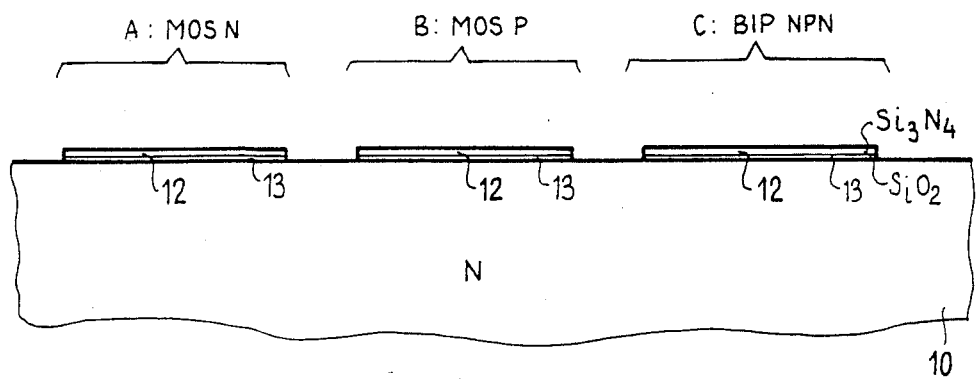
FIG_2
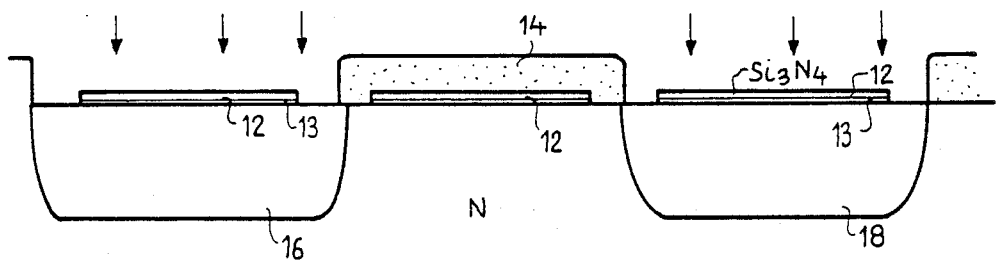
FIG_3
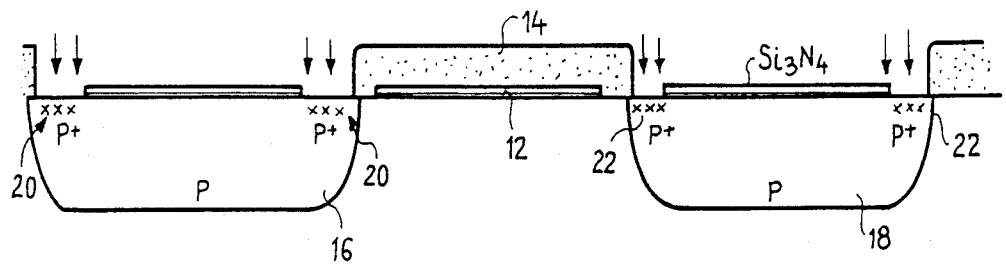

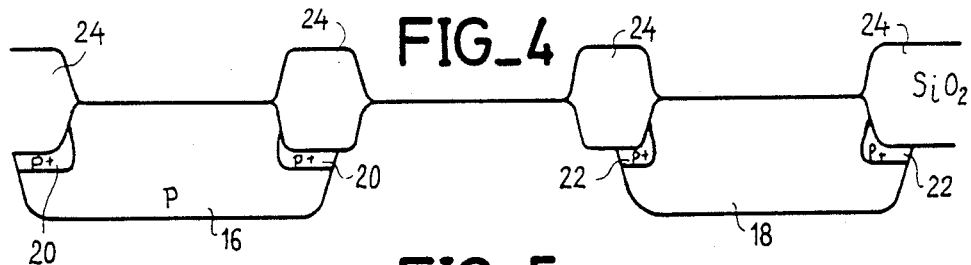
FIG_4
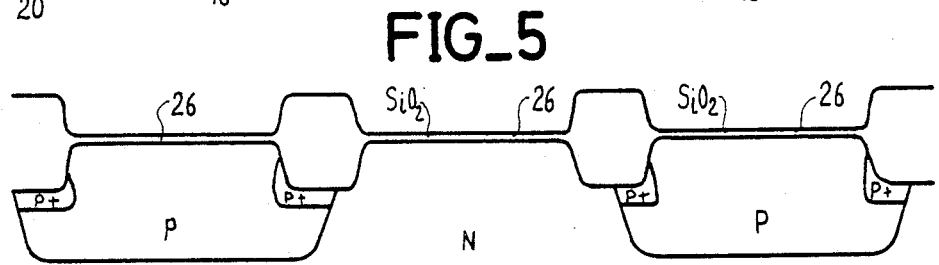
FIG_5
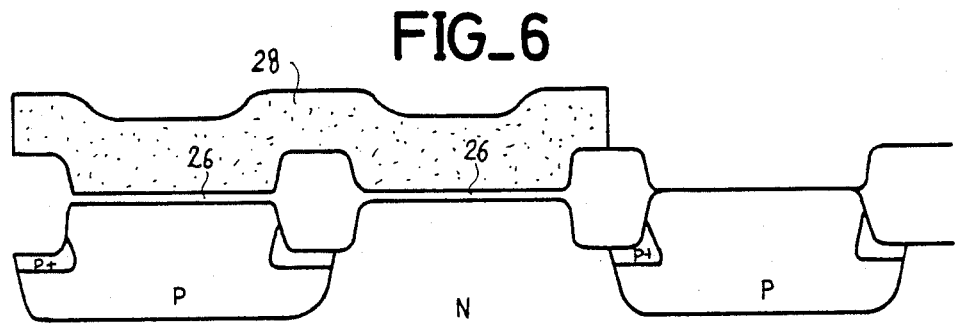
FIG_6
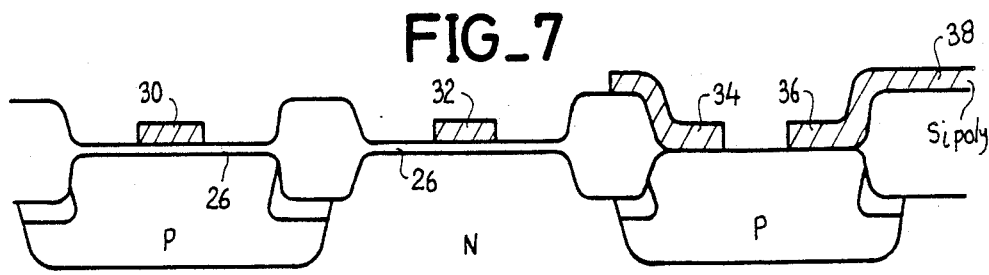
FIG_7
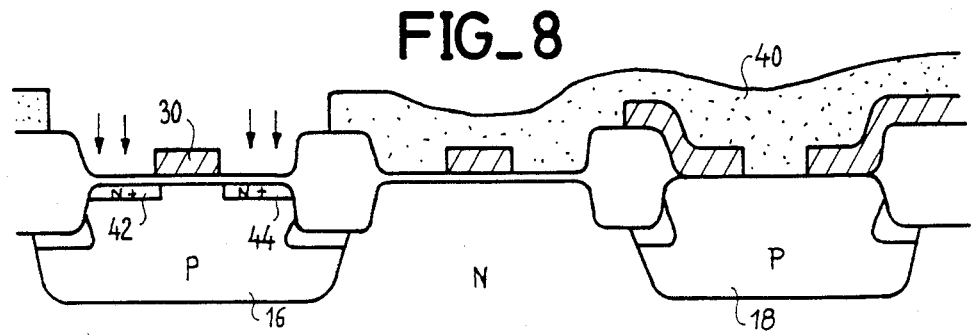
FIG_8

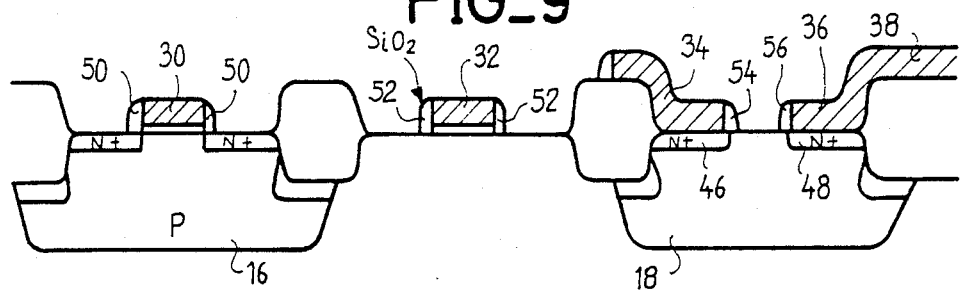
FIG_9
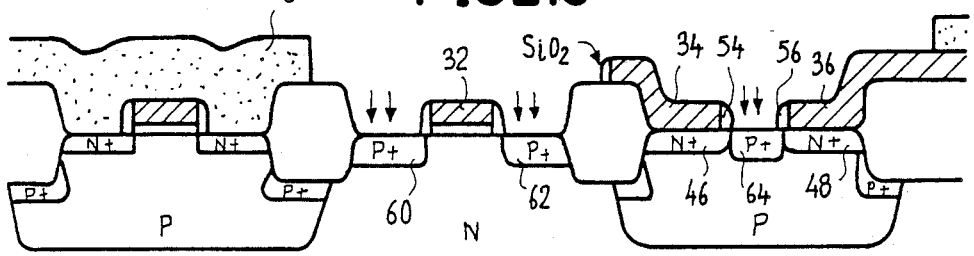
FIG_10
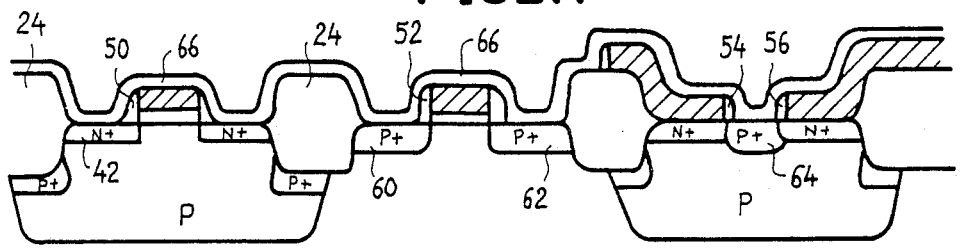
FIG_11
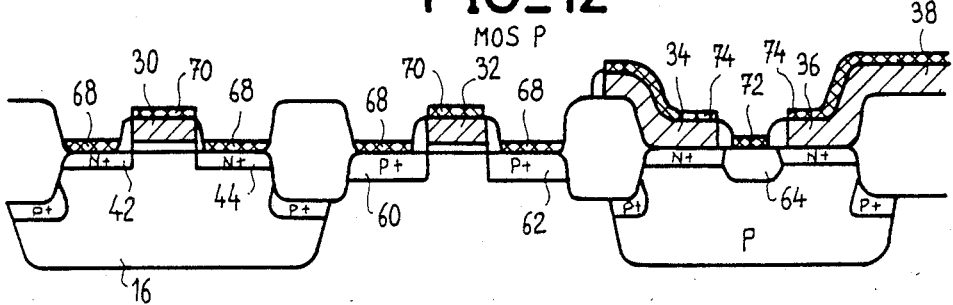
FIG_12

METHOD OF MANUFACTURING FIELD EFFECT TRANSISTORS AND LATERAL BIPOLAR TRANSISTORS ON THE SAME SUBSTRATE

BACKGROUND OF THE INVENTION

1. Field of the Invention

The invention relates to the manufacture of integrated circuits.

In order to benefit simultaneously from the speed of operation of bipolar transistors, the high density of integration of field effect transistors and the low consumption of circuits using judiciously complementary channel N and channel P field effect transistors, efforts are directed more and more to providing technological manufacturing methods which allow both bipolar transistors and channel N and channel P field effect transistors to be formed on the same integrated circuit substrate.

2. Description of the Prior Art

Unfortunately, the technology of manufacturing field effect transistors is very different from the technology for manufacturing bipolar transistors that does not make the juxtaposition of these two types of transistors on the same substrate impossible but it tends to considerably increase the number of technological steps required for manufacturing these combined circuits; if we start with a CMOS (complementary field effect transistor) technology, bipolar transistors cannot be formed with this technology. Then several technological steps are inserted specific to certain stages of the manufacturing process for forming the desired combined circuits.

Now, the manufacturing steps are already numerous and each additional step tends to reduce, on the one hand, the manufacturing efficiency and, on the other, the possibility of keeping to topological drawing rules corresponding to a high integration density.

Finally, certain usual specific steps in bipolar technologies (N epitaxy on P substrate, formation of localized embedded layers) are long and delicate steps which are fortunately not required in CMOS technologies and which must however be introduced when it is desired to combine CMOS and bipolar technologies on the same substrate.

It will thus be readily understood that this problem of integrating two very different technologies is difficult to solve and that combined CMOS/bipolar circuits have only been able to be constructed to the extent that technological mastery allows an acceptable manufacturing efficiency to be obtained despite the large number of manufacturing steps required.

By way of example, the combined CMOS/bipolar technologies which have been proposed up to present comprise at least 12 different masking levels in their simplest versions.

The present invention provides combined CMOS/bipolar technology which, in its simplest version, only comprises nine masking levels and which further more does not use any epitaxy step nor any formation of localized embedded layer.

SUMMARY OF THE INVENTION

The manufacturing method of the invention comprises the following main steps:

(a) a type N monocrystalline silicon substrate is provided in which P type caissons are formed for channel N MOS transistors and for lateral NPN bipolar transistors;

(b) in the substrate active zones are formed separated by thick silicon oxide;

(c) in the active zones a thin isolating layer is formed serving as gate oxide for the MOS transistors;

(d) this oxide is etched so as to bare the silicon of the active zones in regions where the bipolar transistors will be formed;

(e) a polycrystalline silicon layer doped with a type N impurity is deposited capable of serving as source for diffusion of this impurity towards the monocrystalline silicon;

(f) the polycrystalline silicon layer is etched to define a pattern of MOS transistor gates, emitter and collector contacts for the bipolar transistors and interconnections;

(g) the bipolar transistors and the P channel MOS transistors are masked and a type N impurity is implanted in the source and drain regions of the N channel transistors;

(h) isolating embankments are formed against the lateral edges of the etched portions of the silicon layer and the monocrystalline silicon is bared at the surface of the drain and source regions of the MOS transistors and of the base region of the bipolar transistors;

(i) the N channel transistors are masked and a P type impurity is implanted in the source and drain regions of the P channel transistors and in the base region, between the emitter and collector contacts, of the bipolar transistors;

(j) a metal layer is uniformly deposited capable of forming a conducting silicide with the silicon particularly where it comes into contact with the silicon but not where it comes into contact with the isolating embankments and the isolation walls;

(k) a conducting silicide is formed by annealing.

The following steps of the method are conventional.

Moreover, certain steps at the beginning of the method have not been mentioned for they may be treated in several ways: implantation of P type anti-reversal layers, threshold adjustment implantation, annealing. Finally, certain steps such as N type implantation and P type implantation could possibly be reversed.

Diffusion of the N impurity of polycrystalline silicon in the monocrystalline silicon takes place after step f either by specific annealing or by the conventional annealing of the ionic source and drain implantations.

The bipolar transistor formed is a lateral bipolar transistor in a P caisson.

BRIEF DESCRIPTION OF THE DRAWINGS

Other features and advantages of the invention will be clear from reading the following detailed description with reference to the accompanying drawings in which:

FIGS. 1 to 12 represent the successive intermediate steps of the manufacturing method of the invention.

DESCRIPTION OF THE PREFERRED EMBODIMENT

A type N silicon semiconductor substrate 10 is provided in which the active components of the integrated circuit will be formed.

The first step consists in depositing a silicon nitride layer 12 on a fine oxide 13 and photoetching it to a pattern defining the different active zones of the circuit (mask 1).

The active zones are those on which the nitride remains; they will be subsequently separated by thick localized oxide.

In FIG. 1, three active zones have been defined A, B, C, the first corresponding to the formation of an N channel MOS transistor, the second corresponding to the formation of a P channel MOS transistor and the third corresponding to the formation of an NPN bipolar transistor.

The second step (FIG. 2) consists in forming P type caisson in the N substrate. For that, a resin layer 14 is deposited for masking against a high energy ionic implantation. The resin is photoetched so as to leave it still extant where caissons are not to be formed (mask n° 2). A high energy (120 kev to 2 Mev) ionic implantation of a P type impurity is carried out, for example of boron at a dose of $2 \times 10^{11}$ at/cm$^2$; so as to form a P type caisson 16 embodying and completely surrounding zone A (caisson for the N MOS transistor) and a P type caisson 18 embodying and completely surrounding zone C (caisson for the bipolar transistor). The implantation takes place through the nitride 12 and oxide 13. It will be noted that the resin 14 completely and widely protects the active zone B, that is to say the mask surface defining the resin 14 above zone B is wider on all sides than zone B.

The next step is a new ionic implantation (FIG. 3) of a P type impurity. This implantation takes place through the same mask n° 2, that is to say in practice while the resin pattern 14 is still in place. But this time it is a low energy (30 kev) implantation which does not pass through the nitride and which is localized where the silicon substrate is protected neither by nitride nor by the resin. Thus an annular surface zone 20 is formed of type P+ all round the active region A and an annular surface zone 22 all round the active region C.

As a variant, if implantation of the caisson is not made at a very high energy and requires annealing before implantation of regions 20 and 22, the resin 14 is removed before the second implantation, annealing is carried out and a resin is replaced with the same pattern (mask n° 2).

Then resin 14 is removed but not the nitride 12. A thick oxidization of the silicon is carried out, localized by the nitride which prevents oxidization where it is present. Thus a thick silicon oxide layer is formed localized all about the active zone. During this oxidization the P type impurities of regions 20 and 22 are pushed downwards by the growth of the oxide; the P type impurities are distributed by diffusion in the volume of the caissons. Regions 20 and 22 then form antireversal layers preventing the formation of parasite conducting channels between adjacent active zones.

After the thick oxidization, the nitride is removed (FIG. 4).

Then surface oxidization of the bared silicon surface of the active zones is carried out. The result is a thin isolating layer 26 of a few hundred angströms serving as gate insulation for the MOS transistors (FIG. 5).

During this step, if desired, a non localized implantation of impurities may be made over the whole surface of the active zones, for adjusting the threshold voltages of the MOS transistors. Then, using a photosensitive resin layer 28 etched to a mask n° 3, the surface of the active zones A and B is masked while uncovering the active zone C. Then the thin silicon oxide 26 of the active zone C is removed while conserving the thin oxide in zones A and B (FIG. 6).

After removal of resin 28, a highly doped N+ type polycrystalline silicon layer is uniformly deposited (doping during deposition). This layer rests on the monocrystalline silicon in zone C, on the thin oxide 26 in zones A and B and finally on the thick oxide outside the active zones. This layer is sufficiently doped to be able to serve as doping source during a heat annealing step, where it is in contact with a monocrystalline silicon. During a photoetching step (mask n° 4), the polycrystalline silicon is etched to a pattern defining the N channel MOS transistor gates 30 (zone A), the P channel MOS transistor gates 32 (zone B), the bipolar transistor emitter and collecter contacts 34 and 36 (zone C), and interconnections 38 (mainly outside the active zone); FIG. 7 shows the integrated circuit structure at this manufacturing stage.

A photosensitive resin layer 40 is deposited capable of serving as implantation mask, and it is etched with a pattern (mask n° 5) such that the resin protects the active zones B (P MOS) and C (bipolar) and uncovers the zones A (N MOS). Implantation of N type impurities is then carried out for forming the source 42 and the drain 44 of the N channel MOS transistors. The resin 40 as well as gate 30 mask the substrate against this implantation and the source and drain regions are thus self aligned with respect to gate 30 (FIG. 8). The implantation is preferably an implantation of arsenic to a low depth.

Then resin 40 is removed. At this stage, it would be possible to carry out immediately an implantation of the source and drain regions of the P channel transistors as well as of the base of the bipolar transistors by repeating a process similar to the drain and source implantation of the N channel transistors. These two implantations could moreover be reversed.

It is however preferable to form isolating embankments along the vertical edges of the polycrystalline silicon patterns (FIG. 9). The simplest method consists in covering the whole surface of the structure with an insulating layer having a high covering power, namely a layer which is applied not only against the horizontal surfaces but also against the vertical surfaces and which therefore assumes completely the relief of the surface such as it is seen in the Figures; The thickness of the deposition is chosen equal to the desired width for the insulating embankments (at their base). This thickness is substantially constant not only in the vertical direction on the horizontal surfaces but also in the horizontal direction on the vertical surfaces. The deposited layer is preferably a silicon oxide layer deposited by low pressure gaseous phase chemical decomposition. This deposition is followed by annealing which both improves the homogeneity of the deposition and ensures diffusion of the impurities of the emitter 34 and collecter 36 contacts (highly doped N type polycrystalline silicon) towards the monocrystalline silicon with which they are in contact. Thus the emitter 46 and collecter 48 regions of the bipolar transistors of zones C are formed.

Then, by vertical anisotropic etching (reactive ionic etching), the deposited silicon oxide is uniformly etched, the etching continuing over a thickness substantially equal to that which has been deposited. The etching is carried out until the monocrystalline silicon is laid bare in the source and drain regions of the MOS transistors and the base regions of the bipolar transistors, and also until the upper surface of the polycrystalline silicon is laid bare everywhere where it is present.

The vertical etching is interrupted immediately after such baring, so that isolating silicon oxide embankments are left along the vertical edges of all the polycrystalline silicon patterns, i.e. essentially embankments 50 along gates 30 (zones A), embankments 52 along gates 32 (zones B), embankments 54 at the boundary between the emitter and the base of the bipolar transistors and embankments 56 at the boundary between the collector and the base of the bipolar transistors (zone C).

Then a new resin 58 is deposited for masking against an ionic implantation and it is etched (mask n° 6) for laying bare the active zones B and C while protecting the active zones A (FIG. 10).

P type impurities (boron) are implanted for forming the source 60 and drain 62 regions of the P channel MOS transistors, self aligned with respect to gate 32 which also serves as mask; at the same time an implantation is made in the portion of active zone C which separates the emitter contact 34 from the collector contact 36 or more precisely which separates the isolating embankment 54 from the isolating embankment 56 for these embankments also serve as masks. This portion of active zone C implanted with boron then forms a base region 64 for the bipolar transistor (lateral NPN). The base width may be reduced to about 0.6 microns (about 1 to 1.2 micron spacing between the emitter and collector contact, reduced by the lateral diffusion distance of the N+ regions 46 and 48 from the edges of the polycrystalline silicons serving as doping source.

After annealing causing more particularly a slight lateral diffusion of the P type impurities implanted in the preceding step, the surface of the substrate is possibly deoxidized so as to lay the silicon bare solely in the source, drain and base regions of the transistors (active regions not covered with polycrystalline silicon), as well as the surface of the polycrystalline silicon.

Then a layer is deposited of a metal capable of forming a homogeneous conducting compound (silicide) or a conducting alloy with the silicon, for example platinum, tantalum or other metals. This metal will form an alloy with the silicon and must be able to be removed without difficulty where it does not form an alloy.

As can be seen in FIG. 11, the uniformly deposited metal layer 66 comes into contact with a thick oxide of the isolating walls, with the isolating embankments 50, 52, 54, 56, with the monocrystalline silicon of the source and drain (42, 44, 60, 62) and base (64) regions and finally with the polycrystalline silicon of the gates (30, 32), the emitter and collector contacts (34, 36) and interconnections (38).

A convenient method of forming a silicide consists in using platinum as metal for layer 66 and in annealing the substrate. Platinum silicide is only formed where the platinum is in direct contact with the monocrystalline or polycrystalline silicon. After such annealing, the platinum which has not been transformed into silicide is removed with aqua regia, that is to say that which remained on the silicon oxide and thus the structure of FIG. 12 is obtained where the source and drain contact 68 of the N and P channel MOS transistors are made from platinum silicide and are well separated from the gates 30 and 32 which themselves are covered with platinum silicide 70 which is more conducting than monocrystalline silicon. Similarly, the base contact 72 is made from platinum silicide well separated by the isolating embankments from the emitter and collecter contacts 34, 36 which themselves are covered, like interconnections 38, with platinum silicide 74 which improves their conductivity.

With a tantalum deposition instead of platinum by a different process a similar structure could be obtained: by annealing in a dry oxidizing atmosphere at a moderate temperature (about 500° C.) the tantalum may be transformed into tantalum silicide where it is in contact with the monocrystalline or polycrystalline silicon, and into tantalum oxide (isolating) where it is in contact with the silicon oxide. It is then not even necessary to remove the tantalum which has not been transformed into silicide.

The manufacturing method continues with conventional operations: thick oxide deposit, opening of contacts in the oxide (mask n° 7), aluminium deposit, etching of an aluminium interconnection pattern (mask n° 8), deposition of the passivation layer, etching of this layer for opening contact areas for welding access wires (mask n° 9).

What is claimed is:

1. A method of manufacturing an integrated circuit incorporating N and P channel MOS transistors and bipolar transistors, comprising the steps of:
   (a) providing an N type monocrystalline silicon substrate in which P type caissons are formed for N channel MOS transistors and for lateral NPN bipolar transistors;
   (b) forming active zones in the substrate which are separated by thick silicon oxide;
   (c) forming a thin isolating layer in the active zones which serves as gate oxide for the MOS transistors;
   (d) etching the thin oxide isolating layer so as to lay bare the silicon of the active zones in regions where the bipolar transistors will be formed;
   (e) depositing a polycrystalline silicon layer doped with an N impurity and capable of serving as source for diffusing this impurity towards the monocrystalline silicon;
   (f) etching the polycrystalline silicon layer so as to define a pattern of MOS transistors gates, emitter and collector contacts for the bipolar transistors and interconnections;
   (g) masking the bipolar transistors and the P channel MOS transistors and implanting an N type impurity in the source and drain regions of the N channel transistors;
   (h) forming isolating embankments against the lateral edges of the etched portions of the silicon layer and laying bare the monocrystalline silicon at the surface of the drain and source regions of the MOS transistors and of the base region of the bipolar transistors;
   (i) masking the N channel transistors and P type impurities in the source and drain regions of the P channel transistors and in the base region between the emitter and collector contacts of the bipolar transistors;
   (j) uniformly depositing a metal layer capable of forming a conducting silicide with the silicon, particularly where it is in contact with the silicon, but not where it is in contact with the isolating embankments and the isolating walls; and
   (k) annealing the device to form said conductive silicide.

2. The method of claim 1, wherein said metal of said conducting silicide is platinum.

3. The method of claim 2, which further comprises removing said platinum which has not been transformed into conducting silicide with aqua regia.

4. The method of claim 2, wherein said metal of said conducting silicide is platinum.

5. The method of claim 4, which further comprises annealing deposited tantalum in a dry oxidizing atmosphere thereby converting tantalum into tantalum silicide where tantalum contacts monocrystalline and polycrystalline silicon and into tantalum oxide where tantalum contacts silicon oxide.

6. The method of any one of claims 1 to 5, which further comprises forming isolating embankments by depositing silicon oxide as a uniform covering and then vertically anisotropically etching said oxide as necessary.

7. The method of claim 1, which further comprises annealing the device after step (f) to cause the impurity in the polycrystalline silicon to diffuse into the monocrystalline silicon.

* * * * *

UNITED STATES PATENT AND TRADEMARK OFFICE
CERTIFICATE OF CORRECTION

PATENT NO.   :   4,891,328
DATED        :   Jan. 2, 1990
INVENTOR(S)  :   Yvon Gris It is certified that error appears in the above-identified patent and that said Letters Patent is hereby corrected as shown below:

On the title page:

The Assignee is incorrect, "Societe Pour l'Etude et la Fabrication de Circuits Integres Speciauxefcis" should be:

--Societe Pour L'Etude et la Fabrication de Circuits Integres Speciaux -EFCIS- --

Signed and Sealed this

Twelfth Day of March, 1991

*Attest:*

HARRY F. MANBECK, JR.

*Attesting Officer*       *Commissioner of Patents and Trademarks*